(12) United States Patent
Lim et al.

(10) Patent No.: US 7,427,009 B2
(45) Date of Patent: Sep. 23, 2008

(54) CAPILLARY FOR WIRE BONDING

(75) Inventors: Loon A Lim, Singapore (SG); Charles J Vath, III, Singapore (SG)

(73) Assignee: ASM Technology Singapore Pte Ltd., Singapore (SG)

( * ) Notice: Subject to any disclaimer, the term of this patent is extended or adjusted under 35 U.S.C. 154(b) by 0 days.

(21) Appl. No.: 10/877,079

(22) Filed: Jun. 24, 2004

(65) Prior Publication Data

US 2005/0284913 A1    Dec. 29, 2005

(51) Int. Cl.
*B23K 37/00* (2006.01)

(52) U.S. Cl. .................. 228/4.5; 228/180.5; 228/110.1; 228/1.1

(58) Field of Classification Search ............ 228/180.5, 228/110.1, 4.5, 1.1, 54; 29/872, 873, 740, 29/748; 257/784, 786; 219/56, 56.1, 56.21
See application file for complete search history.

(56) References Cited

U.S. PATENT DOCUMENTS

| | | | | |
|---|---|---|---|---|
| 4,315,128 A | * | 2/1982 | Matcovich et al. | 219/85.16 |
| 4,415,115 A | * | 11/1983 | James | 228/170 |
| 4,974,767 A | * | 12/1990 | Alfaro et al. | 228/44.7 |
| 5,379,512 A | * | 1/1995 | Ingle et al. | 29/832 |
| 5,421,503 A | * | 6/1995 | Perlberg et al. | 228/4.5 |
| 5,662,261 A | * | 9/1997 | Fogal | 228/4.5 |
| 6,158,647 A | * | 12/2000 | Chapman et al. | 228/180.5 |
| 6,311,890 B1 | * | 11/2001 | Chapman et al. | 228/180.5 |

* cited by examiner

*Primary Examiner*—Kevin P Kerns
*Assistant Examiner*—Michael Aboagye
(74) *Attorney, Agent, or Firm*—Ostrolenk, Faber, Gerb & Soffen, LLP

(57) ABSTRACT

A capillary tip for deforming a bonding wire during bonding of the wire to a bonding surface comprises a bottom face along an inner periphery of the capillary tip for pressing the bonding wire against a bonding surface, an outer radius along an outer periphery of the capillary tip, and includes a first inclined face adjacent to the bottom face and extending obliquely to the bottom face as well as a second inclined face adjacent to the first inclined face and extending obliquely to the first inclined face.

20 Claims, 3 Drawing Sheets

CAPILLARY FOR WIRE BONDING

FIELD OF THE INVENTION

The invention relates to a capillary for delivering a bonding wire, and in particular to a capillary for use in connecting a wire to a semiconductor device by bonding, for example, by the application of ultrasonic energy.

BACKGROUND AND PRIOR ART

During the packaging of the semiconductor devices, it is typically necessary to place a semiconductor chip or integrated circuit die onto a substrate such as a leadframe, and then electrically connect the die and substrate with conductive bonding wires. In high-power integrated circuit packages, heavy aluminum wire is commonly used to make the connection and carry current between the die and the substrate. These aluminum wires typically have diameters of 5 mils and above, and can be as wide as 20 mils in diameter. The aluminum wires are preferably bonded to bonding pads of the respective die and substrate using wedge bonding.

There are several disadvantages associated with existing wedge bonding of heavy aluminum wires. Firstly, the cost of the heavy wire wedge bonder machines are expensive, which can be up to three times the cost of equivalent ball bonder machines. Secondly, the throughput of wedge bonding machines is very low, and the time it takes to bond a single wire by wedge bonding is up to three times longer as compared to an equivalent ball bonder machine. Hence, it makes economic sense for integrated circuit assembly houses to use copper wire instead of aluminum wire, because copper wire is cheaper and more suitable to ball bonding. Therefore, there are economic and other benefits to replace heavy aluminum wedge bonding machines with copper ball bonding machines.

In wedge bonding, since both the first and second bonds are formed in an identical manner, there is no substantial variation in the current-carrying capacity of the wire throughout the whole wire length as the cross-sectional area of the wire is about the same throughout the wire. Consequently, there is no significant difference in the pull strength of the first wedge bond at a first bonding pad, as compared to the pull strength of the second wedge bond at a second bonding pad. However, in ball bonding, the first bond is formed from a ball and the second bond is effected by pressing the wire between the capillary and the bonding surface resulting in a flattened area with diminished cross-sectional area now referred to as a stitch bond. The current-carrying capacity of the wire at a ball bond area of the first bond is thus higher than the current-carrying capacity of the wire at the stitch bond area of the second bond, where the cross-sectional area of the wire is at the lowest. There is thus a current-carrying bottleneck at the stitch bond. Furthermore, the smaller cross-sectional area means that the lowest bond pull strength of the wire is at the stitch bond.

Presently, copper ball bonding is generally confined to wire diameters of around 2 mils (about 50 microns) and below. For copper ball bonding of wires with wire diameters of more than 2 mils, the lack of stitch pull strength and non-uniformity of the wire causing greater electrical resistance at the stitch bond would pose greater operational issues. It would be desirable to increase the cross-sectional area of the wire at the stitch bond position so as to decrease the bottleneck effect and to increase the pull strength at the stitch bond position.

FIG. 1 is a cross-sectional side view of a capillary 100 according to the prior art. The capillary 100 has a capillary tip 102 that feeds a bonding wire 104 through a capillary hole 106 at the center of the capillary tip 102. There is a bottom face 108 at the base of the capillary tip 102 that is instrumental in pressing the bonding wire 104 onto a bonding surface. Adjacent to the bottom face 108 is a sloping capillary tip face 110, which leads to an outer radius 112 of the capillary tip 102. The sloping capillary tip face 110 forms a face angle A0 with respect to a horizontal bonding surface.

A stitch bond is formed by the capillary tip 102 deforming the wire 104 against the surface to be bonded, typically a "lead" or "second bond surface", thereby producing a wedge-shaped bond. The top part of the stitch bond follows the contour of the sloping capillary tip face 110 and outer radius 112 of the capillary tip 102. The actual area welded or bonded under the stitch is dependent upon the capillary tip face design, the bonding parameters used (ultrasonic power, bonding time, bonding force and bond stage temperature) and the bondability of the material to be bonded to. A smaller face angle A0 of the sloping capillary tip face 110 will result in a stitch that is thinner than a sloping capillary tip face 110 with a larger face angle. Nevertheless, simply increasing the face angle A0 to obtain a thicker stitch would reduce bond strength and lead to an unreliable bond.

FIG. 2 is a cross-sectional side view of a stitch bond formed by the capillary of FIG. 1. The wire thickness X-X at a selected point of the stitch bond where the wire first meets the bonding surface is 39 microns. With this wire thickness for a heavy wire, problems with pull strength and current-carrying capacity as explained above may be experienced.

One prior art method of increasing the pull strength of the wire at the stitch bond position is described in Japanese patent publication number JP2001-291736 entitled "Capillary for Wire Bonding". The publication discloses a capillary with a cone shape facing downward. A leading edge of the capillary is formed in two stages. The leading edge has a bottom face for leading out a fine wire, and an edge of the bottom face is used to cut the fine wire. There is also a step-like peripheral region which is located next to the edge. When the fine wire is cut by ultrasonic bonding, a part of the fine wire which is near the cut end is simultaneously pressed by the step-like peripheral region.

However, this invention is said to be applicable for bonding thin gold wires, specifically gold wires of 10-20 microns in diameter, not heavy wires. Although the step-like peripheral region with orthogonal orientations tends to press the wire at the wedge bond and deforms it to help in improving bond adhesion towards the end of the wire, the relatively flat contact at the bottom face of the capillary cuts the wire rather abruptly. Since the contact area between the stitch bond and the bonding surface is one of the factors that determine stitch pull strength, the flat bottom face of the capillary limits the contact area between the stitch bond and the bonding surface of the die or substrate. The end of stitch profile of the stitch bond is still relatively thin.

Moreover, the stitch bond that is formed has a stepped shape since the peripheral surfaces are parallel and perpendicular to the bottom face respectively, which decreases the uniformity of the wire. There may be a mechanical weakness formed in the bond because the sharp orthogonal edge of the step initiates micro-cracks in the stitch bond which will result in fractures during subsequent operational cycles. Sharp edges of the capillary will lead to very fast build up of wire material resulting in bonds with lower and inconsistent stitch pull strengths. Uniformity of current-carrying capacity at the stitch bond is lacking.

SUMMARY OF THE INVENTION

The invention seeks to provide a capillary for wire bonding which offers improved bond pull strength and current-carrying capacity as compared to the aforementioned prior art.

Accordingly, the invention provides a capillary tip for deforming a bonding wire, comprising: a bottom face along an inner periphery of the capillary tip for pressing the bonding wire against a bonding surface; an outer radius along an outer periphery of the capillary tip; a first inclined face adjacent to the bottom face and extending obliquely to the bottom face; and a second inclined face adjacent to the first inclined face and extending obliquely to the first inclined face.

It would be convenient hereinafter to describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

Examples of preferred embodiments of capillaries in accordance with the invention will now be described with reference to the accompanying drawings, in which.

DETAILED DESCRIPTION OF THE PREFERRED EMBODIMENTS

Figure 3:
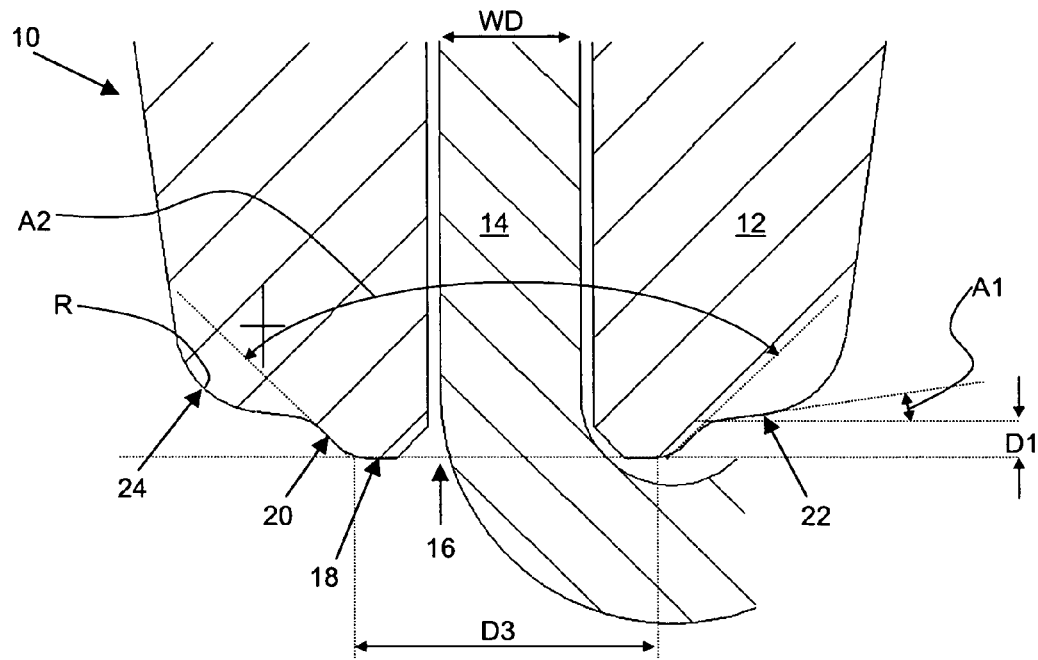
FIG. 3 is a cross-sectional side view of a capillary according to a first preferred embodiment of the invention.

FIG. 3 is a cross-sectional side view of a capillary 10 according to a first preferred embodiment of the invention. The capillary 10 comprises a capillary tip 12 that feeds bonding wire 14 to a bonding location through a chamfered hole 16. A bottom face 18 of the capillary tip 12 is operative to press and deform the bonding wire 14 after a stitch bond is formed at the bonding location. The bonding wire preferably has a diameter of at least 3 mils (76.2 microns) and is preferably made of copper material.

Figure 1:
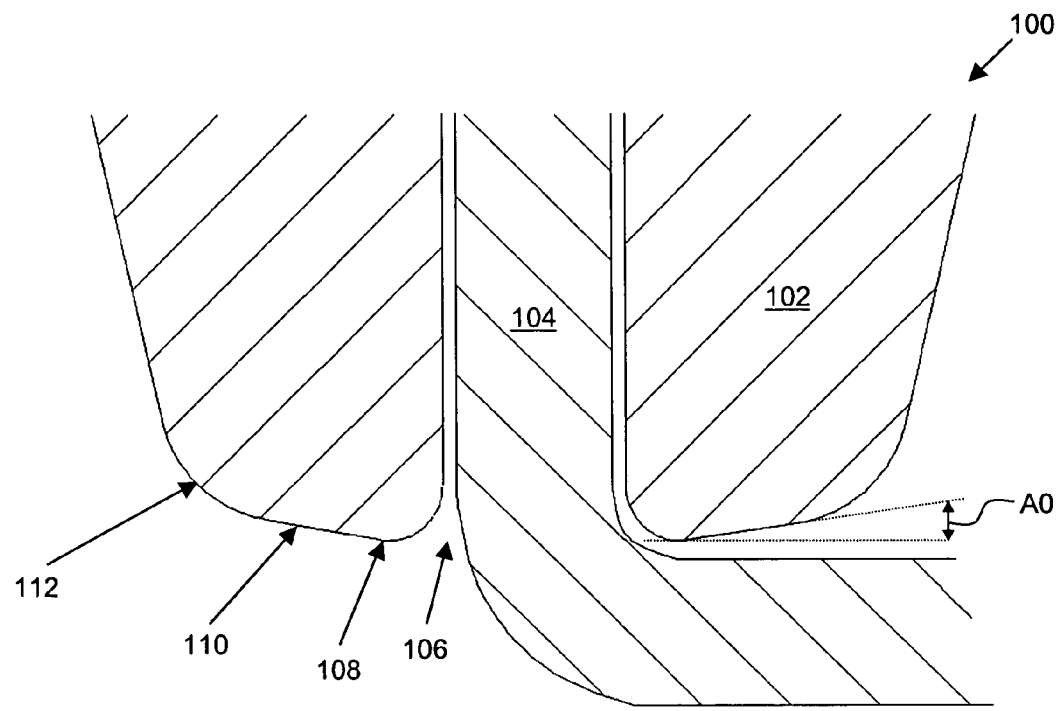
FIG. 1 is a cross-sectional side view of a capillary according to the prior art.

Instead of a single sloping capillary tip face 110 (see FIG. 1) that is found in the prior art, the capillary tip 12 includes a first inclined face 20 adjacent to the bottom face 18 that extends obliquely to the bottom face 18, and a second inclined face 22 that is adjacent to and extends obliquely to the first inclined face 20. In this embodiment, the second inclined face 22 shown in cross-section in FIG. 3 appears as two straight lines. An outside radius 24 along an outer periphery of the capillary tip 12 is adjacent to the second inclined face 22.

The height D1, which is a height of the intersection point of the first and second inclined surfaces 20, 22 from a plane that is coplanar with the bottom face 18, is preferably between 0.1 to 0.5 of the wire diameter, WD of the bonding wire 14, such that: $0.1 \, WD \leq D1 \leq 0.5 \, WD$. More preferably, the height D1 is configured such that: $0.3 \, WD \leq D1 \leq 0.4 \, WD$. The diameter D3 of the outer circumference of the bottom face 18 is preferably between 1½ WD and 3 WD, such that: $1½ WD \leq D3 \leq 3 \, WD$. More preferably, the diameter D3 is configured such that: $2 \, WD \leq D3 \leq 2½ \, WD$.

The outer radius 24 comprising a curved surface preferably has a radius R, where $0.4 \, WD \leq R \leq 1 \, WD$. More preferably, the radius R is configured such that $0.5 \, WD \leq R \leq 0.8 \, WD$.

An angle A1 of the second inclined face 22 with respect to a bonding surface, which is typically horizontal, is preferably between 4 degrees to 11 degrees. More preferably, the angle A1 is between 6 degrees to 10 degrees. An interfacial angle A2 between opposite faces of the first inclined face 20 is preferably between 70 degrees to 120 degrees. More preferably, the angle A2 is between 80 degrees to 100 degrees.

Figure 2:
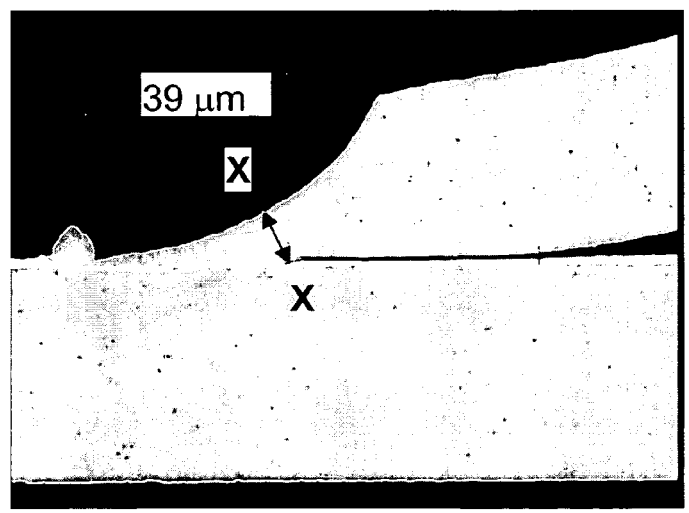
FIG. 2 is a cross-sectional side view of a stitch bond formed by the prior art capillary of FIG. 1.
Figure 4:
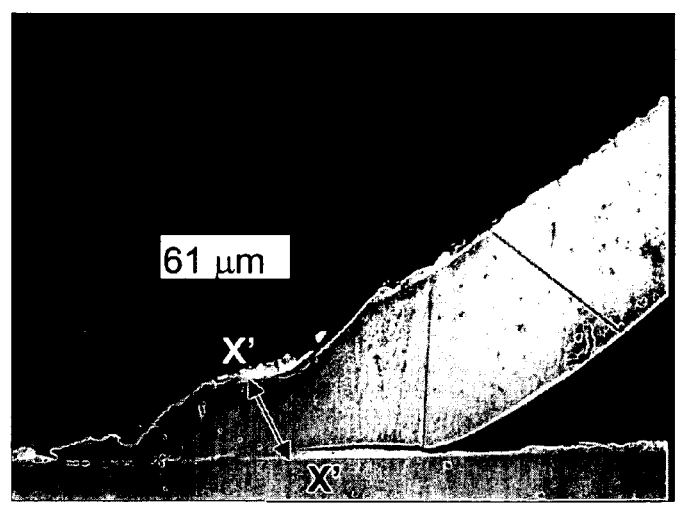
FIG. 4 is a cross-sectional side view of a stitch bond formed by the capillary of FIG. 3.

FIG. 4 is a cross-sectional side view of a stitch bond formed by the capillary of FIG. 3. The wire thickness X'-X' at a selected point of the stitch bond at the point where the bonding wire 14 first meets the bonding surface (which, for comparison, is the same point as that selected in FIG. 2) is 61 microns. Thus, with the capillary 10 according to the preferred embodiment of the invention, the wire thickness at the selected point has been increased from 39 microns to 61 microns. With this wire thickness, the problems with pull strength and current-carrying capacity are significantly reduced.

Figure 5:
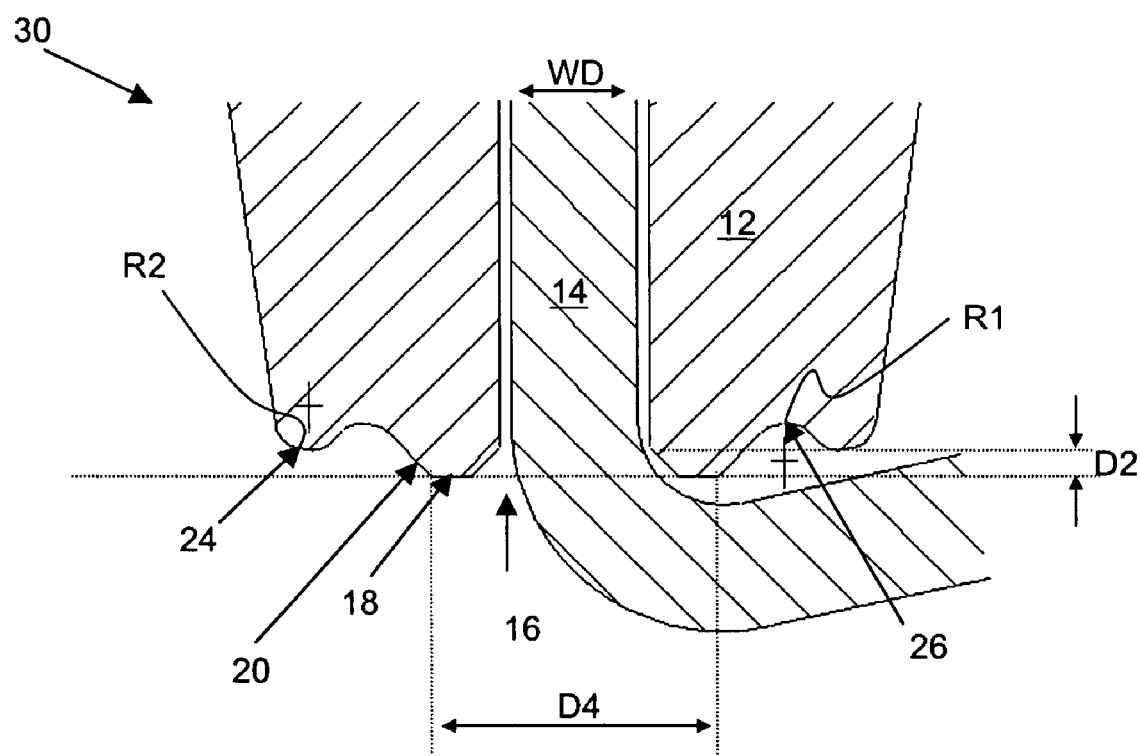
FIG. 5 is a cross-sectional side view of a capillary according to a second preferred embodiment of the invention.

FIG. 5 is a cross-sectional side view of a capillary 30 according to a second preferred embodiment of the invention. The capillary 30 also has a capillary tip 12 including a chamfered hole 16 for feeding the bonding wire 14 to a bonding location. The bottom face 18 is located next to the chamfered hole 16.

Adjacent to the bottom face 18, there is a first inclined face 20 that is adjacent to and extends obliquely to the bottom face 18. A second inclined face, which in this embodiment is in the form of a groove 26, is adjacent to and extends at an oblique angle to the first inclined face 20. The second inclined face or groove 26 is formed adjacent to an outside radius 24 of the capillary tip 12. The main difference between the first and second embodiments of the capillary 10, 30 is that the second inclined face is in the form of a groove 26 rather than a sloping surface 22 appearing in cross-section in FIG. 3 as two straight lines.

The groove 26 preferably has a radius R1, where $0.25 \, WD \leq R1 \leq 0.75 \, WD$. More preferably, the radius R1 of the groove 26 is configured such that $0.35 \, WD \leq R1 \leq 0.55 \, WD$. The outer radius 24 preferably has a radius R2, where $0.25 \, WD \leq R2 \leq 0.75 \, WD$. More preferably, the radius R2 of the outer radius 24 is configured such that $0.35 \, WD \leq R2 \leq 0.55 \, WD$. If R2 is too low, a weakened stitch bond may result.

The height D2 of the lowest point of the outer radius 24 from a plane that is coplanar with the bottom face 18 is preferably from 0.2 times the wire diameter WD, and up to 0.4 times of WD, such that: $0.2 \, WD \leq D2 \leq 0.4 \, WD$. More preferably, the depth D2 is configured such that $0.2 \, WD \leq D2 \leq 0.3 \, WD$. The diameter D4 of the outer circumference of the bottom face 18 is preferably between 1½ and 3 times of WD, such that: $1½ \, WD \leq D4 \leq 3 \, WD$. More preferably, the diameter D4 is configured such that: $2 \, WD \leq D4 \leq 3 \, WD$. With the capillary 10 according to the first embodiment of the invention, an electrical resistance comparison was done on a bonding wire with a diameter of 6 mils and a cross-sectional area of 18232.22 $\mu m^2$. The wire had a length of 5 mm and an average resistance of 0.9269 $\mu$Ohm. It was found that the stitch bond made from the capillary 10 had an electrical resistance that was 27% lower than a prior art capillary 100 illustrated in FIG. 1, as demonstrated in Table A below:

TABLE A

| Capillary Design | Width of Stitch (μm) | Thickness of Stitch (μm) | Cross-sectional area (μm²) | Resistance 1 (R) μ Ohm |
|---|---|---|---|---|
| Conventional | 275.89 | 39.39 | 10,867.46 | 1.5551 |
| Invention | 245.695 | 60.61 | 14,891.57 | 1.1349 |

Further, the capillary 10 was found to have a current-carrying capacity that was 37% higher than a prior art capillary 100, as demonstrated in Table B below:

TABLE B

| Capillary Design | Stitch Cross-sectional area (μm²) | Wire Length (mm) | Fusing Time (sec) | Fusing Current (A) |
|---|---|---|---|---|
| Conventional | 10,867.46 | 5 | 5 | 28.72 |
| Invention | 14,891.57 | 5 | 5 | 39.36 |

It was also found that on a stitch pull tests conducted on a total of thirty-six wires for each of the conventional design and the design according to a preferred embodiment of the invention, the capillary 10 was able to achieve an average stitch pull strength of 360.077 g, whereas the prior art capillary 100 was able to achieve an average stitch pull strength of 260.427 g. The average increase in stitch pull strength by using a capillary 10 according to the preferred embodiment of the invention was therefore about 100 g.

The invention described herein is susceptible to variations, modifications and/or additions other than those specifically described and it is to be understood that the invention includes all such variations, modifications and/or additions which fall within the spirit and scope of the above description.

The invention claimed is:

1. A capillary tip for deforming a bonding wire, comprising:
    a bottom face surrounding an inner periphery at the bottom of the capillary tip, the bottom face extending substantially radially in a direction along an intended bonding surface for pressing the bonding wire against the bonding surface;
    a first inclined inwardly tapering surface, which appears as two straight lines when viewed in cross-section, and having a single interfacial angle between the two straight lines, the first inclined surface being located between the bottom face and a second inclined inwardly tapering surface, which appears as two straight lines when viewed in cross-section, a lower end of the first inclined surface merging with a radially outer margin of the bottom face; and
    the second inclined inwardly tapering surface, which is located between the first inclined surface and an outer periphery of the capillary tip, the second inclined surface extending obliquely to the first inclined surface, the second inclined surface being inclined at a single angle with respect to the bonding surface.

2. The capillary tip as claimed in claim 1, wherein a height from an intersection between the first and second inclined to a plane that is coplanar with the bottom face is between 0.1 to 0.5 times of a diameter of the bonding wire.

3. The capillary tip as claimed in claim 2, wherein the height is between 0.3 and 0.4 times of a diameter of the bonding wire.

4. The capillary tip as claimed in claim 1, wherein a diameter of an outer circumference of the bottom face is between 1½ and 3 times of a diameter of the bonding wire.

5. The capillary tip as claimed in claim 4, wherein the diameter is between 2 and 2½ times of a diameter of the bonding wire.

6. The capillary tip as claimed in claim 1, wherein the outer periphery comprises a curved surface with a radius of between 0.4 times of a diameter of the bonding wire, and the diameter of the bonding wire.

7. The capillary tip as claimed in claim 6, wherein the outer periphery comprises a radius of between 0.5 and 0.8 times of a diameter of the bonding wire.

8. The capillary tip as claimed in claim 1, wherein the single angle of the second inclined surface with respect to the bonding surface is between 4 degrees and 11 degrees.

9. The capillary tip as claimed in claim 8, wherein the single angle of the second inclined surface with respect to the bonding surface is between 6 degrees and 10 degrees.

10. The capillary tip as claimed in claim 8, wherein the single interfacial angle is between 70 degrees and 120 degrees.

11. The capillary tip as claimed in claim 10, wherein the single interfacial angle is between 80 degrees and 100 degrees.

12. The capillary tip as claimed in claim 1, wherein the capillary tip is configured to bond bonding wire which has a diameter of at least 3 mils.

13. The capillary tip as claimed in claim 12, wherein the capillary tip is configured to receive and bond copper wire.

14. A capillary tip for deforming a bonding wire, comprising:
    a bottom face surrounding an inner periphery at the bottom of the capillary tip, the bottom face extending substantially radially in a direction along an intended bonding surface for pressing the bonding wire against the bonding surface;
    a first inclined inwardly tapering surface, which appears as two straight lines when viewed in cross-section, located between the bottom face and a second inclined surface, a lower end of the first inclined surface merging with a radially outer margin of the bottom face; and
    the second inclined surface comprising a groove having a radius, located between the first inclined surface and an outer periphery of the capillary tip, the second inclined surface extending obliquely to the first inclined surface.

15. The capillary tip as claimed in claim 14, wherein the groove comprises a radius of between 0.25 and 0.75 times of a diameter of the bonding wire.

16. The capillary tip as claimed in claim 15, wherein the groove comprises a radius of between 0.35 and 0.55 times of a diameter of the bonding wire.

17. The capillary tip as claimed in claim 14, wherein the outer periphery comprises a radius of between 0.25 and 0.75 times of a diameter of the bonding wire.

18. The capillary tip as claimed in claim 17, wherein the outer periphery comprises a radius of between 0.35 and 0.55 times a diameter of the bonding wire.

19. The capillary tip as claimed in claim 14, wherein a height of a lowest point of the outer periphery from a plane that is coplanar with the bottom face is between 0.2 and 0.4 times of a diameter of the bonding wire.

20. The capillary tip as claimed in claim 19, wherein the height of the lowest point of the outer periphery from the plane is coplanar with the bottom face is between 0.2 to 0.3 times of a diameter of the bonding wire.

* * * * *